United States Patent
Kris

(10) Patent No.: US 9,921,982 B2
(45) Date of Patent: Mar. 20, 2018

(54) DEVICE AND METHOD TO ASSIGN DEVICE PIN OWNERSHIP FOR MULTI-PROCESSOR CORE DEVICES

(71) Applicant: Microchip Technology Incorporated, Chandler, AZ (US)

(72) Inventor: Bryan Kris, Gilbert, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 316 days.

(21) Appl. No.: 14/729,879

(22) Filed: Jun. 3, 2015

(65) Prior Publication Data

US 2015/0356037 A1    Dec. 10, 2015

Related U.S. Application Data

(60) Provisional application No. 62/008,273, filed on Jun. 5, 2014.

(51) Int. Cl.
  G06F 13/28 (2006.01)
  G06F 13/38 (2006.01)
  G06F 15/78 (2006.01)
  H03K 19/173 (2006.01)

(52) U.S. Cl.
  CPC .......... *G06F 13/287* (2013.01); *G06F 13/385* (2013.01); *G06F 15/7814* (2013.01); *H03K 19/1732* (2013.01)

(58) Field of Classification Search
  CPC ...... G06F 1/22; G06F 13/385; G06F 13/4068; H03K 19/1732
  See application file for complete search history.

(56) References Cited

U.S. PATENT DOCUMENTS

| | | | | |
|---|---|---|---|---|
| 6,496,880 | B1 | 12/2002 | Ma et al. ......................... 710/38 |
| 7,199,607 | B2 * | 4/2007 | Volkening .......... H03K 19/1732 326/104 |
| 7,543,261 | B2 * | 6/2009 | Lindberg ............ G06F 17/5072 716/119 |
| 7,859,134 | B2 * | 12/2010 | Chi ........................... G06F 1/26 307/80 |
| 7,962,670 | B2 * | 6/2011 | Lim ...................... G06F 13/364 710/36 |
| 8,327,173 | B2 * | 12/2012 | Hendin ................. G06F 1/3203 713/323 |
| 2003/0018944 | A1 | 1/2003 | Chae et al. .................... 716/113 |

(Continued)

OTHER PUBLICATIONS

"Microchip Introduces Smallest, Lowest-Cost PIC32 Microcontrollers", 4 pages dated Oct. 24, 2011; obtained from web address: http://eecatalog.com/8bit/2011/10/24/microchip-introduces-smallest-cost-pic32-microcontrollers/.*

(Continued)

*Primary Examiner* — Brian Misiura
(74) *Attorney, Agent, or Firm* — Slayden Grubert Beard PLLC

(57) ABSTRACT

An embedded device has a plurality of processor cores, each with a plurality of peripheral devices, wherein each peripheral device has an output. Furthermore, a housing with a plurality of assignable external pins and a protected pin ownership logic for each assignable external pin is provided and configured to be programmable to assign an output function of an associated assignable external pin to only one of the plurality of processor cores.

22 Claims, 3 Drawing Sheets

(56) References Cited

U.S. PATENT DOCUMENTS

| | | | |
|---|---|---|---|
| 2006/0132178 A1 | 6/2006 | Volkening et al. | 326/81 |
| 2011/0260752 A1 | 10/2011 | Jouin et al. | 326/41 |
| 2013/0080677 A1* | 3/2013 | Simmons | G06F 13/4068 710/316 |
| 2015/0356039 A1* | 12/2015 | Kris | G06F 13/385 710/104 |
| 2016/0231376 A1* | 8/2016 | Kris | G01R 31/3177 |
| 2016/0267046 A1* | 9/2016 | Kris | G06F 13/4282 |
| 2016/0267047 A1* | 9/2016 | Kris | G06F 13/4282 |

OTHER PUBLICATIONS

Microchip—"Introducing Microchip's Smallest, Lowest-Cost PIC32 Microcontrollers"; 2 pages, Dated Nov. 2011.*
International Search Report and Written Opinion, Application No. PCT/US2015/034378, 10 pages, dated Oct. 1, 2015.

* cited by examiner

US 9,921,982 B2

DEVICE AND METHOD TO ASSIGN DEVICE PIN OWNERSHIP FOR MULTI-PROCESSOR CORE DEVICES

RELATED PATENT APPLICATION

This application claims priority to commonly owned U.S. Provisional Patent Application No. 62/008,273; filed Jun. 5, 2014; which is hereby incorporated by reference herein for all purposes.

TECHNICAL FIELD

The present disclosure relates to multi-processor core devices, in particular multi-processor core microcontrollers.

BACKGROUND

A microcontroller is a system on a chip and comprises not only a central processing unit (CPU), but also memory, I/O ports, and a plurality of peripherals. A multi-processor core device, such as a multi-core microcontroller, comprises not only one CPU but two or more central processing cores. Such a device provides increased performance, improved security, and aiding software development. In embedded devices, these devices require to use a housing with a high number of pins.

Most multi-core devices are designed for symmetrical multi-processor core operation where the processor cores are designed not to be "different" in function or purpose. Such systems have no need to have one specific processor core to have control of a specific device pin. Other devices that have asymmetrical multi-processor core typically use the other "core(s)" as dedicated functions such as floating point which do not need access to device pins.

Yet, other devices with multi-processor cores are implemented in high pin count packages where the specific device pins can be assigned to specific processor cores.

SUMMARY

Therefore, a need exists for multi-core devices with a reduced number of external pins.

According to an embodiment, an embedded device may comprise: a plurality of processor cores, each comprising a plurality of peripheral devices, wherein each peripheral device may comprise an output; a housing comprising a plurality of assignable external pins; and a protected pin ownership logic for each assignable external pin and configured to be programmable to assign an output function of an associated assignable external pin to only one of the plurality of processor cores.

According to a further embodiment, the protected pin ownership logic may comprise a multiplexer having as many inputs as processor cores of the embedded device and a single output. According to a further embodiment, the protected pin ownership logic may further comprise a locking logic configured to prevent a re-assignment of the associated assignable external pin. According to a further embodiment, the protected pin ownership logic may comprise a configuration register configured to select a processing core through a multiplexer. According to a further embodiment, the configuration register may be arranged in flash memory of the associated processing core. According to a further embodiment, a specified write sequence may be necessary to write to the configuration register. According to a further embodiment, each processor may comprise for each assignable external pin a peripheral pin select module that is configured to select an output of one of the plurality of peripheral devices associated with that processor. According to a further embodiment, each peripheral pin select module can be configured to be controllable only by the associated processing core. According to a further embodiment, the peripheral pin select module may comprise a special function register controlling a multiplexer. According to a further embodiment, each processing core may be a 32 bit processing core and the housing comprises less than or equal to 32 external pins. According to a further embodiment, the housing may comprise 28 external pins. According to a further embodiment, an input functionality of an external pin can be routed to more than one peripheral device or processing cores.

According to another embodiment, a method for arranging multiple processing cores in an embedded device may comprise the steps: arranging a plurality of processor cores in a housing, each comprising a plurality of peripheral devices, wherein each peripheral device may comprise an output, and wherein the housing comprises a plurality of assignable external pins; and providing for each assignable external pin a protected pin ownership logic configured to be programmable to assign an output function of an associated assignable external pin to only one of the plurality of processor cores.

According to a further embodiment, the method may comprise the step of controlling a multiplexer within the protected pin ownership logic, the multiplexer having as many inputs as processor cores of the embedded device and a single output. According to a further embodiment, the method may comprise the step of controlling a locking logic within the protected pin ownership logic to prevent a re-assignment of the associated assignable external pin. According to a further embodiment, the method may comprise the step of programming a configuration register to select a processing core through a multiplexer. According to a further embodiment of the method, at reset of the embedded device, a pin configuration stored in said configuration register is transferred to a multiplexer control for selecting an output. According to a further embodiment of the method, the configuration register can be arranged in flash memory of the associated processing core. According to a further embodiment of the method, a specified write sequence may be necessary to write to the configuration register. According to a further embodiment of the method, each processor may comprise for each assignable external pin a peripheral pin select module and the method comprises select an output of one of the plurality of peripheral devices associated with that processor through a multiplexer of the peripheral pin select module. According to a further embodiment of the method, each peripheral pin select module can be configured to be controllable only by the associated processing core. According to a further embodiment of the method, an input functionality of an external pin can be routed to more than one peripheral device or processing cores.

DETAILED DESCRIPTION

According to various embodiments, a limited number of device pins can be assigned to each processor's peripheral(s)

in the device while maintaining application flexibility, and provide protection from inadvertent interference from one processor to affecting the functionality of another processor's device pin(s). According to various embodiments, a methodology can be provided that provides asymmetric multi-processor core devices with the ability to specify which processor owns a particular device pin for purposes of output.

A Peripheral Pin Select (PPS) function module allows to assign variably certain external pins to internal functions. The PPS module is implemented for each functional pin in the device for each processor on the device.

According to an embodiment, a multi-processor microcontroller can be designed that can be arranged in a housing having less pins than a bus width of each of the processing cores. Thus, a 28 pin housing may comprise for example a dual core microcontroller wherein each core is a 32 bit microprocessor core.

Figure 1:
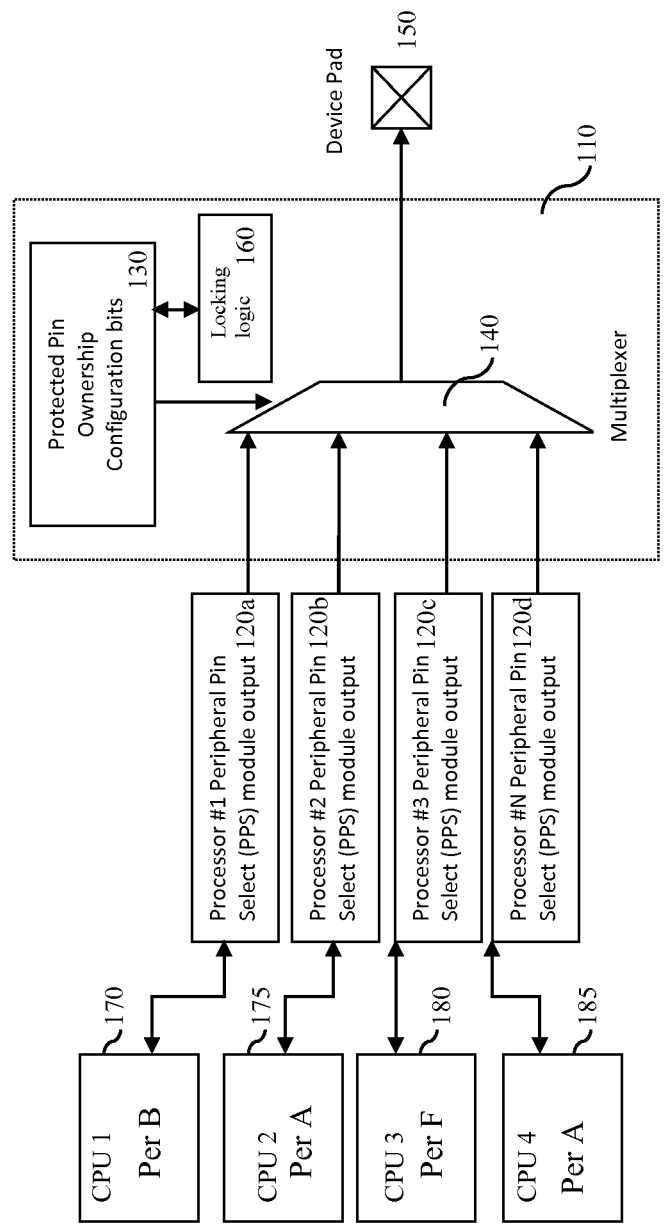
FIG. 1 shows a block diagram of an embodiment of a pin assignment logic.

FIG. 1 shows an embodiment of a single chip microcontroller with, for example, four processor cores (not shown in FIG. 1). A plurality but limited number of assignable external pins 150 are provided. In addition, such a device may of course have certain fixed function pins whose function cannot be altered, such as, for example, power supply pins. Each processor core is associated with its own peripheral pin select (PPS) module 120a, b, c, d for each external assignable pin. Each PPS module 110a, b, c, d comprises logic 110 for each processor for each functional device pin 150 (only one per processing core shown in FIG. 1). Thus, there is a Pin Ownership Logic (POL) block 110 for each functional device pin 150 and each processing core.

The logic may for example comprise a configuration register 130 that controls a multiplexer 140 that selects the outputs of the peripheral chosen to drive a device pin 150. According to various embodiments, the output selection is replicated so that other circuitry can decide which processor's peripheral actually gains access to the respective device pin 150.

FIG. 1 shows four exemplary peripheral devices, wherein each is owned by one of four processing cores. However, each processing core may comprise a plurality of peripheral devices or modules. Peripheral devices may have input and/or output functionality. While inputs may be routed to various peripherals, even peripherals associated with different processing cores, only one output functionality of one selected peripherals device can be assigned to an external pin as otherwise a collision or conflict would occur. An I/O port associated with a processing core may be considered as a peripheral device or module according to various embodiments and its output functionality is therefore assignable to an external pin.

In the specific embodiment of FIG. 1, the first peripheral 170 is associated with CPU 1, the second peripheral 175 is associated with CPU 2, the third peripheral 180 is associated with CPU 3 and the fourth peripheral is associated with CPU 4. Respective peripheral pin select modules 120a, b, c, d are programmed to select one of a plurality of peripherals. FIG. 1 only shows the selected peripheral. However, as each PPS module 120 is designed to actually select a peripheral device or module from its pool of peripherals, each PPS module 120 may be connected to a plurality of peripheral devices or modules of an associated CPU as will be explained with respect to FIG. 2 in more detail.

FIG. 1 further shows with the indicated block 110 a typical instance of the POL (Pin Ownership Logic) logic that is associated with each functional pin 150 in the device. Each pin 150 has a multiplexer 140 controlled by configuration bits 130 located, for example, in protected memory (such as flash memory). These configuration bits 130 are programmed by the user to specify which processor has access to outputting on a specific device pin 150. The configuration bits 130 control respective multiplexers 140 that select the data from a preselected peripheral owned by the selected processor. This POL block 110 is replicated for each functional device pin.

Figure 2:
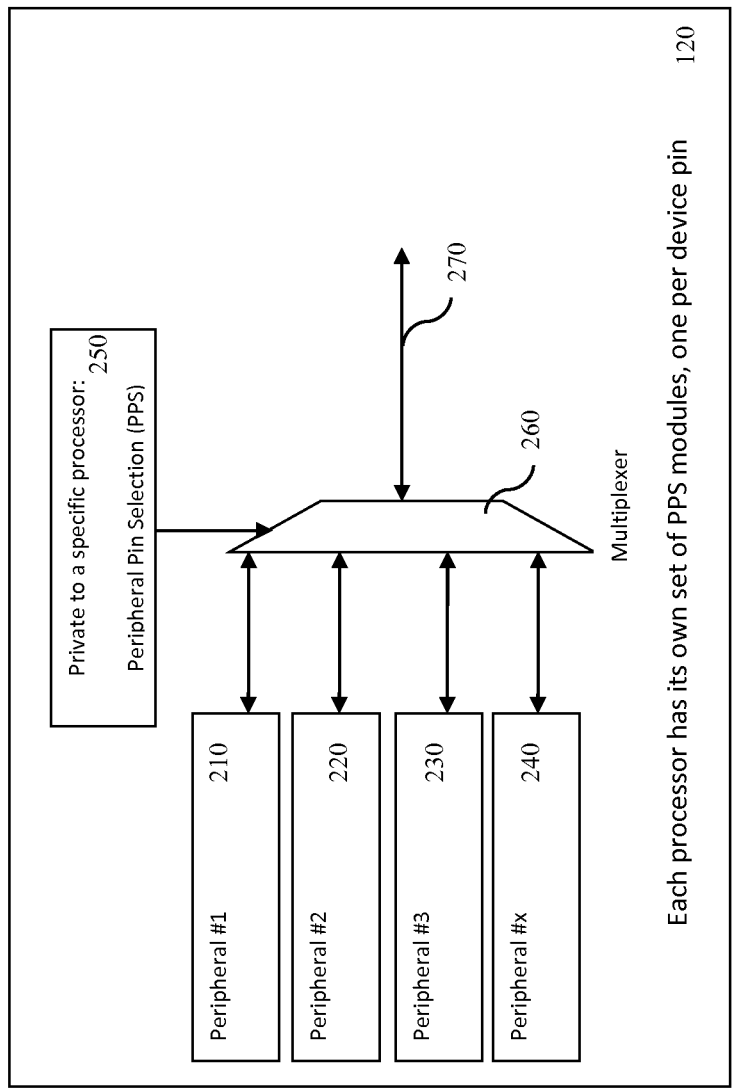
FIG. 2 shows an embodiment of peripheral pin select module according to FIG. 1.

FIG. 2 shows another diagram of an embodiment of a typical PPS module 120. It shows an exemplary logic within a single PPS module. Each processor may own one or more peripheral devices 210, 220, 230, 240. Some or all of these peripheral devices may be coupled with a multiplexer 260 that is controlled by a register 250. According to some embodiments, register 250 is private to the respective processor that owns the peripherals. The output 270 of multiplexer 260 is coupled with the multi-processor core pin ownership logic 110.

According to various embodiments, an embedded system comprising a multi-processor core can be designed for very low pin count packages, for example a 28-pin housing may be used for microcontroller with a dual core. In such a low pin housing, device pins are a scarce commodity, therefore a mechanism is provided according to various embodiments to allow a user to assign peripheral pin functionality.

According to various embodiments, a methodology can be provided that enables each processor core in an asymmetrical multi-processor core device to specify which of its peripheral functions are connected to a functional device pin. The term "asymmetrical" means that each processing core may have different peripheral devices associated with it, wherein certain peripherals may be unique to only one core and others may be embedded in more than one or all cores.

To this end, each processor in a multi-core device has:
A PPS multiplexer 260 for each pin.
Each PPS multiplexer has registers 250 that specify the peripheral connections to the device pin. Register 250 can be a special function register that can only be accessed by one processing core, namely the owner of the respective peripherals. The special function register 250 may be preferably memory mapped to the random access memory (RAM). This special function register may otherwise operate similar to the configuration register controlling the ownership as explained below.

Any external pin designated to provide an output function has an associated PPS. Also, in some embodiments, each processing core may have a different number of PPS and not all external pins may be available for each processing core.

Pin Ownership Configuration bits 130 associated with each device pin 150 are located preferably in Flash and/or RAM memory according to various embodiments. These pin ownership configuration bits 130 may control which processor core has authority to output a signal on each device pin 150. For example, such a register may have four bits in a four core device. Internal control logic may allow that only one bit is set at a time. For example, the setting of one bit may automatically clear all other bits. Other mechanisms may be possible, for example, a two bit register may be used wherein a stored value represents an association with a respective core. If a configuration register has more bits than needed, then invalid settings would simply assign a respective pin to no specific processor. Such a pin could then be used for input only.

All processor cores may use a device pin for input functions at the same time, but the ability to output a signal on a specific device pin is specific by the customer via the Pin ownership configuration bits 130.

According to some embodiments, each functional device pin has:

Associated pin ownership configuration bits in non-volatile flash memory; and

Associated pin multiplexer controlled by the pin configuration bits.

The flash memory may comprise write lock logic which prevents accidental pin configuration changes. The user configures the pin ownership bits, for example, during programming. Thus, according to such an embodiment, the pin ownership can only be changed during the programming and cannot be changed dynamically under program control. At reset, the pin configuration info is transferred to the MUX control.

Thus various embodiments provide a protected means to define which processor owns which device pins for purposes of output.

According to further embodiments, the control software may further include routines that allow a change of assignments only if, for example, a locking mechanism 160 as, for example, shown in FIG. 1 is not activated for a pin. Thus, a re-assignment of certain pins can be blocked. Thus, a pin may be only re-assignable if a certain task by one processor core has been finished.

According to yet a further embodiment, such a blocking function may be established in an associated control register 160. For example a plurality of bits may indicate for which processor core the blocking function is provided. According to yet a further embodiment, only the assigned processor core for which the blocking function has been activated may be able to reset the blocking function. Thus, the blocking of a pin assignment may only be lifted by the processor for the pin is currently assigned.

Figure 3:
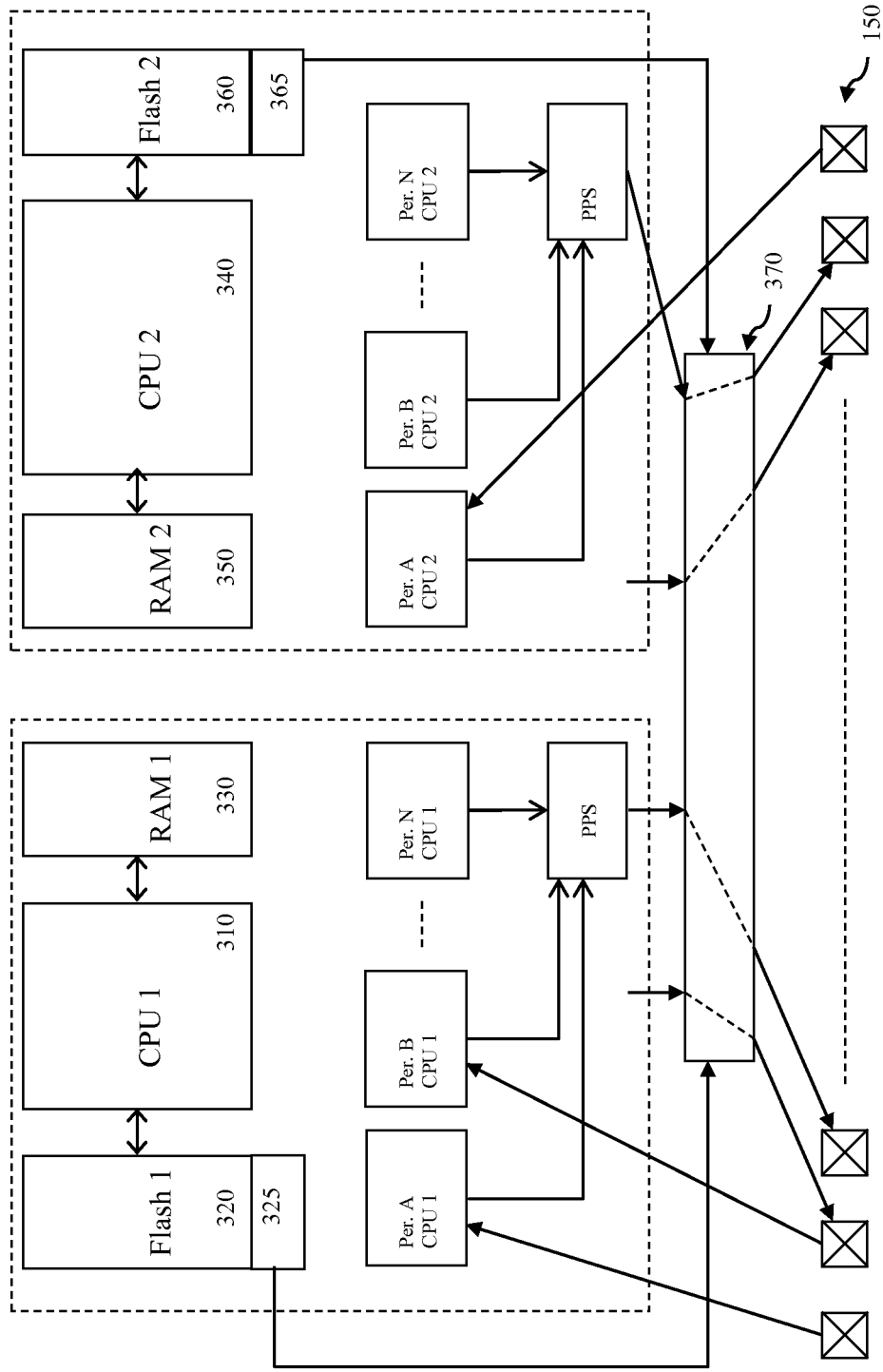
FIG. 3 shows a block diagram of an exemplary dual core microcontroller.

FIG. 3 shows a block diagram of an embodiment of a dual core microcontroller in a single housing. As can be seen, the device comprises basically two separate processing cores 310 and 340 each having a plurality of associated peripheral devices and its own memory. The processing cores may a Harvard structure with separate program memory, e.g., flash memory and data memory. However, other architecture may apply. With respect to these elements, the microcontroller do not share any of their resources. The integrated circuit device, thus, comprises basically two separate microcontrollers each comprising a CPU 310, 340, flash memory 320, 360, random access memory 330, 350 and a plurality of peripheral devices or modules (Per. A, Per B . . . Per N) associated with the respective CPU 310 or 340. The peripherals of each processing core 310, 320 may be controlled through respective special function registers which can be preferably memory mapped to the respective RAM 330 and 360. In particular the PPS control register 250 as shown in FIG. 2 can be memory mapped to the RAM. Thus, privacy to the respective core is ensured as the other processing cores do not have access to any memory that is not assigned to them.

As indicated in FIG. 3, the flash memory may include configuration registers 325 and 365, respectively, which may control the setting of the PPO module 370. PPO module is shown in FIG. 3 as one block and may contain a plurality of PPO units each responsible for a single external pin. FIG. 3 indicates an exemplary setting programmed into unit 370 by dotted lines connecting the outputs of certain peripherals with some of the external pins 150 according to a setting of the configuration bits in flash memory 325 and 365. However, other configuration methods may apply, such as volatile or non-volatile registers arranged in RAM or separately from the main memory.

The invention claimed is:

1. An embedded device comprising:
a plurality of processor cores, each comprising a plurality of peripheral devices, wherein each peripheral device may comprise an output;
a housing comprising a plurality of assignable external pins; and
a protected pin ownership logic for each assignable external pin and configured to be programmable to assign an output function of an associated assignable external pin to only one of the plurality of processor cores.

2. The embedded device according to claim 1, wherein the protected pin ownership logic comprises a multiplexer having as many inputs as processor cores of the embedded device and a single output.

3. The embedded device according to claim 1, wherein the protected pin ownership logic further comprises a locking logic configured to prevent a re-assignment of the associated assignable external pin.

4. The embedded device according to claim 1, wherein the protected pin ownership logic comprises a configuration register configured to select a processing core through a multiplexer.

5. The embedded device according to claim 4, wherein the configuration register is arranged in flash memory of the associated processing core.

6. The embedded device according to claim 5, wherein a specified write sequence is necessary to write to the configuration register.

7. The embedded device according to claim 1, wherein each processor comprises for each assignable external pin a peripheral pin select module that is configured to select an output of one of the plurality of peripheral devices associated with that processor.

8. The embedded device according to claim 7, wherein each peripheral pin select module is configured to be controllable only by the associated processing core.

9. The embedded device according to claim 7, wherein the peripheral pin select module comprises a special function register controlling a multiplexer.

10. The embedded device according to claim 1, wherein each processing core is a 32 bit processing core and the housing comprises less than or equal to 32 external pins.

11. The embedded device according to claim 10, wherein the housing comprises 28 external pins.

12. The embedded device according to claim 1, wherein an input functionality of an external pin can be routed to more than one peripheral device or processing cores.

13. A method for arranging multiple processing cores in an embedded device comprising the steps of:
arranging a plurality of processor cores in a housing, each comprising a plurality of peripheral devices, wherein each peripheral device may comprise an output, and wherein the housing comprises a plurality of assignable external pins; and
providing for each assignable external pin a protected pin ownership logic configured to be programmable to assign an output function of an associated assignable external pin to only one of the plurality of processor cores.

14. The method according to claim 13, the method comprising the step of controlling a multiplexer within the protected pin ownership logic, the multiplexer having as many inputs as processor cores of the embedded device and a single output.

15. The method according to claim 13, the method further comprising the step of controlling a locking logic within the protected pin ownership logic to prevent a re-assignment of the associated assignable external pin.

16. The method according to claim 13, the method further comprising the step of programming a configuration register to select a processing core through a multiplexer.

17. The method according to claim 16, wherein at reset of the embedded device, a pin configuration stored in said configuration register is transferred to a multiplexer control for selecting an output.

18. The method according to claim 16, wherein the configuration register is arranged in flash memory of the associated processing core.

19. The method according to claim 18, wherein a specified write sequence is necessary to write to the configuration register.

20. The method according to claim 13, wherein each processor comprises for each assignable external pin a peripheral pin select module and the method comprises select an output of one of the plurality of peripheral devices associated with that processor through a multiplexer of the peripheral pin select module.

21. The method according to claim 20, wherein each peripheral pin select module is configured to be controllable only by the associated processing core.

22. The method according to claim 20, wherein an input functionality of an external pin can be routed to more than one peripheral device or processing cores.

\* \* \* \* \*